(12) United States Patent
Tran et al.

(10) Patent No.: US 8,170,404 B2
(45) Date of Patent: May 1, 2012

(54) BUBBLER FOR CONSTANT VAPOR DELIVERY OF A SOLID CHEMICAL

(75) Inventors: Nam Hung Tran, Pasadena, TX (US); Dennis L. Deavenport, Houston, TX (US); Taeho Ko, Kingwood, TX (US); Nada El-Zein, Evanston, IL (US)

(73) Assignee: Akzo Nobel N.V., Arnhem (NL)

( * ) Notice: Subject to any disclaimer, the term of this patent is extended or adjusted under 35 U.S.C. 154(b) by 841 days.

(21) Appl. No.: 11/579,889

(22) PCT Filed: May 17, 2005

(86) PCT No.: PCT/EP2005/052247
§ 371 (c)(1),
(2), (4) Date: Nov. 10, 2006

(87) PCT Pub. No.: WO2005/113857
PCT Pub. Date: Dec. 1, 2005

(65) Prior Publication Data
US 2007/0221127 A1   Sep. 27, 2007

Related U.S. Application Data

(60) Provisional application No. 60/572,687, filed on May 20, 2004.

(51) Int. Cl.
*A01G 13/06* (2006.01)
*B05C 11/00* (2006.01)

(52) U.S. Cl. ........................................ 392/386; 118/667

(58) Field of Classification Search .......... 392/386–406; 219/401; 186/667, 666
See application file for complete search history.

(56) References Cited

U.S. PATENT DOCUMENTS

| 4,506,815 A * | 3/1985 | Melas et al. .................. 222/630 |
| 4,704,988 A | 11/1987 | Mellet |
| 4,734,999 A | 4/1988 | Fujisawa et al. .............. 34/57 A |
| 4,916,828 A | 4/1990 | Yamane et al. .................... 34/10 |
| 4,947,790 A | 8/1990 | Gartner et al. ................ 118/715 |
| 5,019,423 A * | 5/1991 | Hiai et al. .................. 427/248.1 |
| 5,232,869 A | 8/1993 | Frigo et al. .................... 437/133 |
| 5,502,227 A | 3/1996 | Kanjolia et al. .................. 556/1 |

(Continued)

FOREIGN PATENT DOCUMENTS

EP    0 323 145 A1    7/1989

(Continued)

OTHER PUBLICATIONS

International Search Report for International Application No. PCT/EP2005/052247, Jul. 28, 2005.

(Continued)

*Primary Examiner* — Daniel L Robinson
(74) *Attorney, Agent, or Firm* — Timothy D. Meade (57) ABSTRACT

A bubbler chamber assembly comprising one chamber or two or more chambers connected in series, all chambers being in substantially vertical orientation. A solid or liquid source of the compound is contained in the chamber or chambers. The ratio between the length of the chamber or combined length of chambers connected in series with respect to the direction of flow of the carrier gas through the chamber or chambers and the average diameter equivalent of the cross section of the chamber or chambers with respect to the direction of flow of the carrier gas through the chamber or chambers is not less than about 6:1.

23 Claims, 11 Drawing Sheets

U.S. PATENT DOCUMENTS

| | | | |
|---|---|---|---|
| 5,553,395 A | 9/1996 | Wen et al. .................. 34/359 |
| 5,603,169 A | 2/1997 | Kim .................. 34/587 |
| 5,755,885 A | 5/1998 | Mikoshiba et al. |
| 6,036,783 A | 3/2000 | Fukunaga et al. |
| 6,444,038 B1 | 9/2002 | Rangarajan et al. .......... 118/715 |
| 7,031,600 B2 * | 4/2006 | Yadav et al. .................. 392/389 |
| 7,437,060 B2 * | 10/2008 | Wang et al. .................. 392/389 |
| 2002/0078894 A1 | 6/2002 | Timmons et al. ............. 118/726 |
| 2003/0082300 A1 * | 5/2003 | Todd et al. ............... 427/255.27 |
| 2005/0126489 A1 * | 6/2005 | Beaman et al. .............. 118/724 |
| 2005/0132959 A1 * | 6/2005 | Bauch et al. .................. 118/667 |

FOREIGN PATENT DOCUMENTS

| | | |
|---|---|---|
| GB | 404005 | 1/1934 |
| GB | 2 223 509 A | 4/1990 |
| JP | 61-183195 A | 8/1986 |
| JP | 62-011536 A | 1/1987 |
| JP | 64-25523 A | 1/1989 |
| JP | 3-181123 A | 8/1991 |
| JP | 4-045837 A | 2/1992 |
| JP | 5-251348 A | 9/1993 |
| JP | 06-151311 A | 5/1994 |
| JP | 6-196415 A | 7/1994 |
| JP | 11-193462 A | 7/1999 |
| JP | 2003/303772 | 10/2003 |
| WO | WO 93/19223 A1 | 9/1993 |
| WO | WO 99/28532 | 6/1999 |
| WO | WO 01/92172 A1 | 12/2001 |

OTHER PUBLICATIONS

Derwent Abstract of JP 2003/303772.
International Preliminary Report on Patentability dated Jul. 10, 2006 from corresponding application PCT/EP2005/052247.
Written Opinion dated Aug. 3, 2005 from corresponding application PCT/EP2005/052247.
English translation of Russian office action dated Apr. 7, 2009 in Russian Application No. 2006145280.
Abstract from esp@cenet abstracting JP 5-251348.
Patent Abstracts of Japan abstracting JP 6-196415.
Patent Abstracts of Japan abstracting JP 4-45837.
Abstract from esp@cenet abstracting JP 3-181123.
Abstract from esp@cenet abstracting JP 64-25523.
Patent Abstracts of Japan abstracting JP 61-183195.
Patent Abstracts of Japan abstracting JP 62-11536.
Abstract from esp@cenet abstracting GB 404005.
English translation of Chinese office action dated Dec. 18, 2009 in corresponding Chinese Application No. 200580015933.7.
English translation of Ukraine office action dated Nov. 18, 2008 in corresponding Ukraine Application No. 200613504.
Timmons et al., "A Study of Cylinder Design for Solid OMVPE Sources," Journal of Crystal Growth 221 (2000) pp. 635-639.
Communication from a foreign patent office dated Mar. 24, 2009 relating to case U.S. Appl. No. 11/579,889, filed Nov. 10, 2006.
English language translation of the communication from a foreign patent office dated Mar. 24, 2009 relating to case U.S. Appl. No. 11/579,889, filed Nov. 10, 2006.
English language translation of the communication from a foreign patent office (Rejection Decision) dated Jul. 19, 2011 relating to case U.S. Appl. No. 11/579,889.
Machine translation of JP 11-193462 dated Jul. 21, 1999.
Machine translation of JP 06-151311 dated May 31, 1994.
JP 2007-517248 Office Action Translation dated Mar. 22, 2011.
Third Party Submission Translation dated Sep. 1, 2011.

* cited by examiner

Front View​ ​ Top View​ ​ Side View

Epison Profile of TMIn Concentration versus Consumption

FIGURE 10

Epison Profile of TMIn Concentration versus Consumption

FIGURE 11

Epison Profile of TMIn Concentration versus Consumption

BUBBLER FOR CONSTANT VAPOR DELIVERY OF A SOLID CHEMICAL

BACKGROUND OF THE INVENTION

1. Field of the Invention

This invention relates to the providing of organometallic vapor for the manufacture of semiconductors.

2. Prior Art

For MOCVD growth, organometallic compounds are the source materials for the compound semiconductor industry. The organometallic compounds that are typically used as precursors for the chemical vapor deposition include trimethylaluminum (TMAl), trimethylgallium (TMG), triethylgallium (TEG), trimethylantimony (TMSb), dimethyl hydrazine (DMHy), trimethylindium (TMI), and cyclopetadienylmagnesium ($Cp_2Mg$).

Typically, a volatile organometallic compound for vapor phase deposition is provided in a bubbler and subjected to a constant temperature wherein a carrier gas, such as hydrogen or nitrogen, is introduced to transport the compound and deliver it to a vapor phase deposition chamber.

A good organometallic precursor delivery technique provides a gas stream with a known, constant, controllable amount of contained organometallic. For liquid organometallic compounds, this is generally a straightforward exercise since mass transport and vaporization kinetics are fast enough to provide near-saturation concentrations at most reasonable flow rates of carrier gas. The term "bubbler" is used generically in the CVD industry to refer to any container for a precursor utilized for delivery of a carrier gas saturated in the aforementioned precursor.

In the case of solid organometallics, notably TMI, obtaining consistent delivery has proved to be an ongoing problem. In this case, vaporization kinetics are slower and dependent on issues such as product morphology, temperature, gas contact time, and surface area. Finely divided, irregularly shaped material with a high surface area will evaporate faster than a uniform, dense, more massive material. Mass transport is also more problematic. It is important to allow sufficient contact time for the slower evaporation process, and it is important to keep the carrier gas moving across all exposed surfaces at rates sufficient to deliver the appropriate amount of precursor to the CVD chamber. Channeling, for instance, will reduce both contact time and the area exposed to the flowing gas. Other factors, such as pressure changes as the carrier gas flows through the precursor bed, are known to cause erratic delivery rates and changes in degree of carrier gas saturation.

It is also highly desirable to provide a constant and stable delivery of vapor from a solid organometallic precursor at a near-saturation concentration in compound semiconductor device manufacture. Unstable vapor delivery rates for solid organometallic precursors are affected by a number of factors:

Reduction of total surface area of the solid is in progress continuously due to the depletion of the solid precursor. Small, high surface area particles are evaporated preferentially, causing rapid reduction of surface area early in the lifetime of the bed.

Channeling which may occur due to the erosion of the solid precursor bed.

Changes in pressure inside the bed during operation.

Grain growth effects due to the agglomeration process which occur with the evaporation and sublimation of the solid material along with a concurrent equilibrium in which redeposition occurs on solid precursor surfaces. At gas saturation, evaporation and redeposition occur at the same rate but bed morphology changes to favor lower surface area.

Gas paths become shorter and the available surface area becomes reduced as the solid precursor is consumed. Therefore, saturation of the carrier gas with the vapor of organometallic precursor becomes increasingly unlikely.

An ideal bubbler design has to overcome the aforementioned problems and needs to achieve the following goals:

Provide a stable, constant vapor delivery rate until substantially complete depletion of the solid organometallic in the bubbler takes place.

Provide saturation or near-saturation concentration at most common and reasonable operating parameters such as temperature, pressure, carrier gas type ($N_2$, $H_2$, etc.) and flow rate of the carrier gas.

Provide fast response and fast re-establishment of a stable, constant vapor delivery rate when operating parameters are changed.

There are known general approaches to the delivery of vapors from solid organometallics:

1) Solution TMI: The drawbacks noted in the industry when using "solution TMI" include entrainment of aerosols of the solvent and inconsistent and changing delivery rates for total Indium when using TMI/TEI.
   a) U.S. Pat. No. 5,232,869 (1993): as practiced by Epichem. In this case, a suspended liquid is used to overcome kinetic and mass transport. Solid precursor dissolves into the solvent as it is depleted by evaporation to maintain equilibrium conditions and consistent delivery rates.
   b) U.S. Pat. No. 5,502,227 (1996): TMI dissolved in $R_3In$, such as triethylindium (TEI)

2) Another general approach is a bubbler design that improves the uniformity of flow and solid-gas contact in the bubbler. Strategies that have hitherto been employed include:
   a) U.S. Pat. No. 4,916,828 (1990): The use of TMI mixed or dispersed with a "packing".
   b) U.S. Pat. No. 4,734,999 (1987): The use of a bubbler incorporating a dip tube fitted with a frit distributor at the end of the tube and with a reduced bubbler diameter at the bottom versus at the top.
   c) U.S. Pat. No. 5,019,423 (1991): This design uses a carrier gas flowing upwardly through a packed bed of solid organometallic on top of a partition containing a plurality of pores.
   d) U.S. Pat. No. 4,947,790 (1990): A carrier gas flows in the direction of the gravitation force in the following sequence: through a thick gas inlet plate, a powder solid bed, and a thin gas outlet plate.
   e) PCT Patent Publication No. WO 99/28532 (1999): ultrasonic vaporizer is used.
   f) U.S. Pat. No. 5,603,169 (1997): The use of a bubbler containing an exhaust tube, a compressing plate and a pair of porous thin plates is described.
   g) U.S. Published Patent Application No. 2002/0078894 A1 (2002): this bubbler contains a metal sintered filter rather than a conventional dip tube.
   h) U.S. Pat. No. 5,553,395 (1996): The use of a cone shaped (conical) bubbler is described in this patent.
   i) Japanese Published Patent Application No. 2003/303772): This bubbler is a solid organometallic compound packing container having a flow direction switching pipe crossed through a partition plate that vertically divides the container.

Unfortunately, none of the previously described bubbler designs have solved all the problems of solid organometallic delivery. None of the aforementioned bubbler designs are capable of providing a uniform delivery rate with a maximum pick-up of precursor material until substantially complete depletion of the vapor source occurs over a wide operational range. Each bubbler design has a limited range of parameters where it operates most efficiently. Breakthrough of non-saturated carrier gas occurs prematurely or gradually as the solid substrate is depleted. Premature breakthrough results in poor delivery efficiency and wasting of valuable organometallic product due to early removal and replacement with a new bubbler. A slow drop-off in percent carrier gas saturation can lead to production of sub-standard deposition layers if undetected during the deposition process.

The present invention solves the aforesaid problems.

SUMMARY OF THE INVENTION

In its primary embodiment, the present invention comprises a bubbler for providing a vaporized compound in a chemical vapor deposition process comprising: (a) a bubbler chamber assembly having an inlet and an outlet; (b) a means for providing an inert carrier gas connected to the inlet; (c) a means for removing the vaporized compound and carrier gas from the chamber assembly and conveying the compound to the chemical vapor deposition process connected to the outlet; and (d) temperature control means in which the bubbler chamber assembly is placed that causes the compound to vaporize into the carrier gas.

The bubbler chamber assembly comprises one chamber or two or more chambers connected in series, all chambers being in substantially vertical orientation. The chamber or chambers contain a solid or liquid source of the compound. The ratio between the length of the chamber or combined length of chambers connected in series with respect to the direction of flow of the carrier gas through the chamber or chambers and the average diameter equivalent of the cross section of the chamber or chambers with respect to the direction of flow of the carrier gas through the chamber or chambers is not less than about 6:1.

Other embodiments of the invention encompass details including length, diameter and orientation of the chambers, composition of the compound and carrier gas, all of which are hereinafter described in detail.

DETAILED DESCRIPTION OF THE INVENTION

Figure 1A:
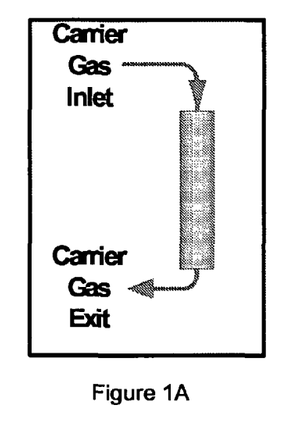
FIG. 1A: The basic concept of a carrier gas flowing through a long, narrow column packed with the subjected solid material.
Figure 1B:
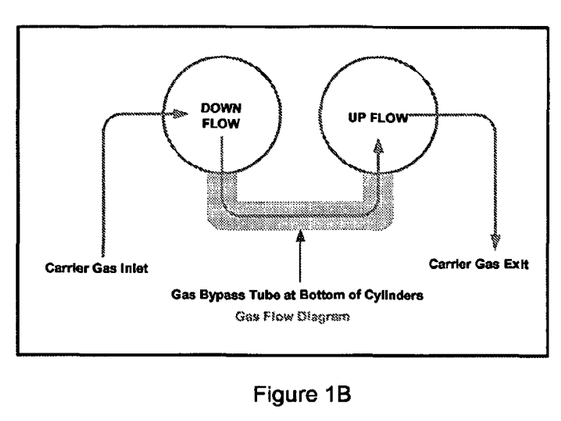
FIG. 1B: A gas flow diagram for two chambers in series.
Figure 1C:
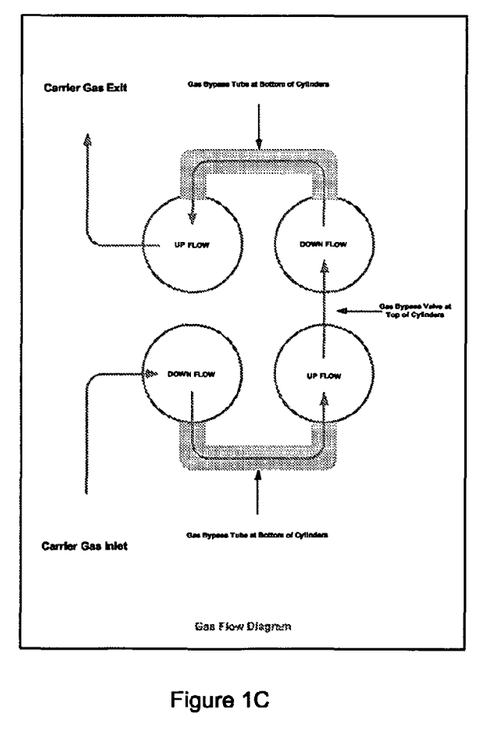
FIG. 1C: A gas flow diagram for four chambers in series.

It was found that passing a carrier gas through a bubbler as summarized above loaded with trimethylindium (TMI) provided a stable gas stream that was saturated with TMI vapor until most of the TMI loaded in the column was depleted. (see FIG. 1A). Based on this observation, the present invention provides an improved delivery device for a solid source (MOCVD) system.

The bubbler design concept includes a narrow, long unique cylinder design that provides a saturation or near-saturation concentration of precursor vapor in the carrier gas. This narrow, long cylinder design overcomes the previously described heat and mass transport problems since it allows for maximum contact of the carrier gas with the solid material by minimizing channeling of the gas through the compound and by being conducive to maximum heat transfer through the chamber wall into the compound. Therefore, the bubbler can be used at lower pressures and higher carrier gas flow rates as compared to conventional bubblers.

The vapor pressure of a chemical is directly related to temperature. To keep a constant vapor pressure, the bubblers in use are either immersed in a constant temperature bath or are jacketed with a custom-made external heat exchanger. Most of MOCVD machines are equipped with the first option. The configurations of such bubblers are limited to the dimensions of the constant temperature bath. Therefore, instead using a single long straight tube, the bubbler may have to be fabricated with single or multiple tube bending, or with a bundle of tubes connected together in series, or with concentric tubes.

The bubbler design of the present invention provides continuous, stable delivery rates of solid source material until the majority of the source material is depleted. Such bubblers may include some or all of the features described below:

- Construction material: Any suitable material, such as glass, plastic, or metal, which is inert to the solid source contained therein. Stainless steel is preferred because it is a standard specification in MOCVD industry;
- The bubbler has an inlet port for introducing carrier gas, an exhaust outlet port for exiting the vapor saturated carrier gas after contact with the solid source, and one or more fill ports for loading the compound source;
- The inlet and outlet ports of the bubbler can be installed either with or without a frit;
- The bubbler can comprise either a single chamber or multiple chambers;
- The internal diameters of the chambers can be the same or different throughout their length;
- The diameters or average diameter equivalent of the chambers are in the range of from about 1.3 cm. to about 7.6 cm;

The chambers are not restricted to circular shape in their cross-sections. They can be round, oval, square, rectangular, helical, or anything else known to one skilled in the art;

The chambers may be equipped with internal baffles or corrugations to increase the effective path length.

The chambers are connected in series and are in a substantially vertical position, but preferably are positioned at least about 45° from the horizon line. However, they can also be connected in a zig-zag pattern at an angle of at least 45° from a horizontal line;

The chambers can communicate using connectors that have same or smaller cross-sectional diameters of the chambers.

The bubbler assembly may comprise two or more chambers in series with connectors between chambers in adjoining sequence comprising tubes of substantially horizontal orientation having average diameters from about 1.3 cm to about 7.6 cm connected at each end with the chambers in adjoining sequence, the connection between the chambers of adjoining sequence and tubes of the connectors may be being mitered or rounded fittings;

The chambers may be connected such that said carrier gas passes from one tube to the next in a serial manner to maintain carrier gas saturation conditions at the bubbler tube assembly outlet for as long as possible while there is organometallic compound in the bubbler assembly. For example, as illustrated in Example 1, a bubbler of the invention packed with trimethylindium with a controlled temperature of 17° C. achieves a supply of saturated carrier gas for over 95% of the time there is trimethylindium in the bubbler.

Figure 6:
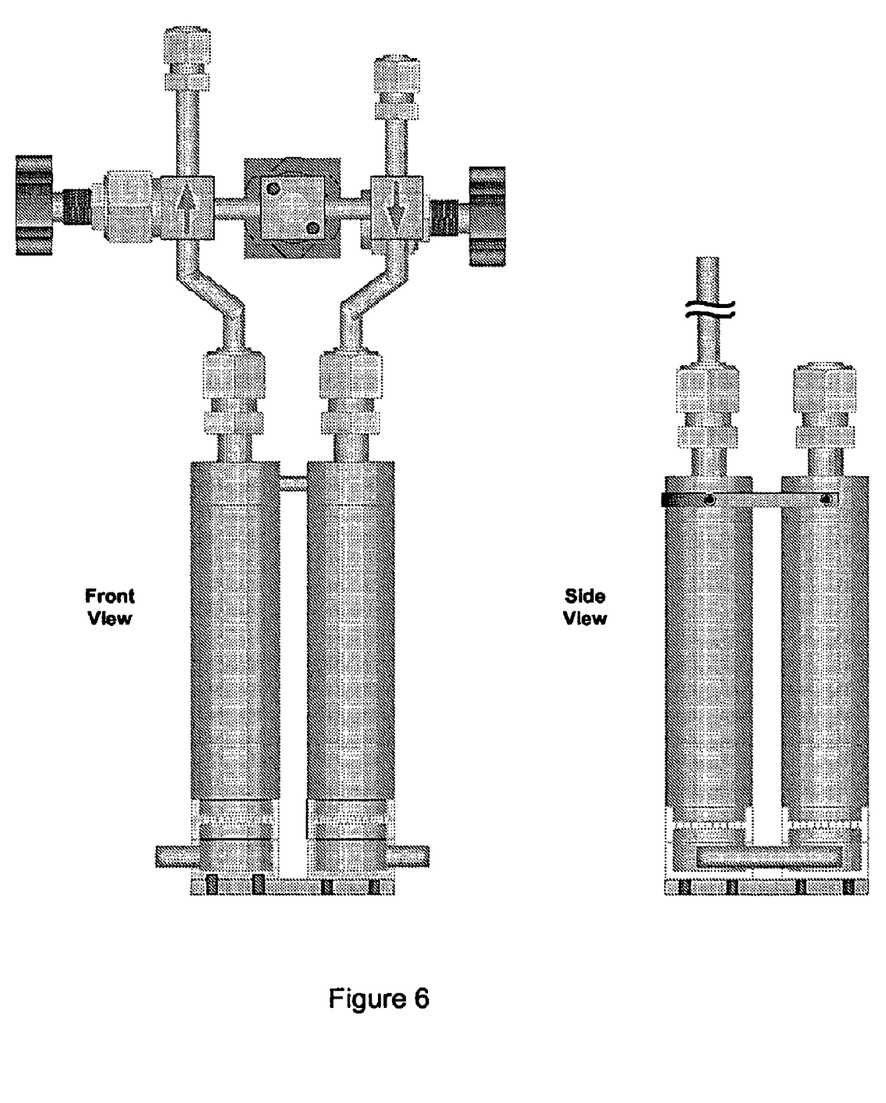
FIG. 6: A four chamber bubbler with a frit at the bottom of each chamber.
Figure 7:
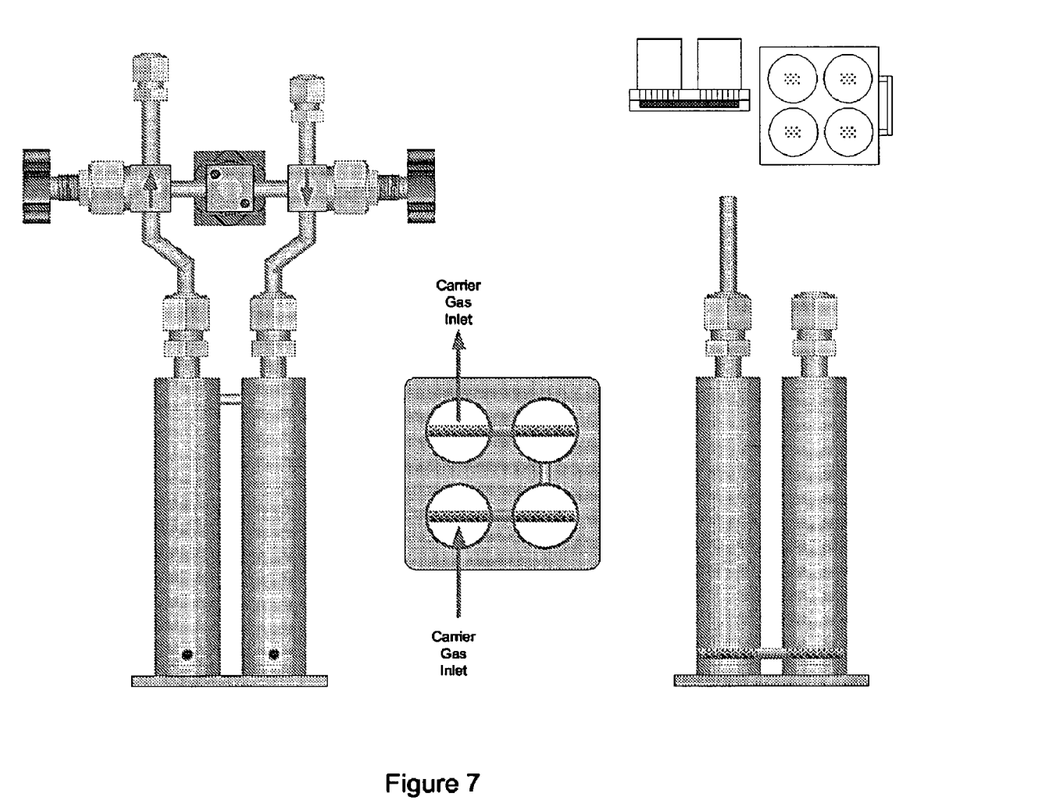
FIG. 7: A four chamber bubbler with a gas dispersing tube at the bottom of each chamber.
Figure 8:
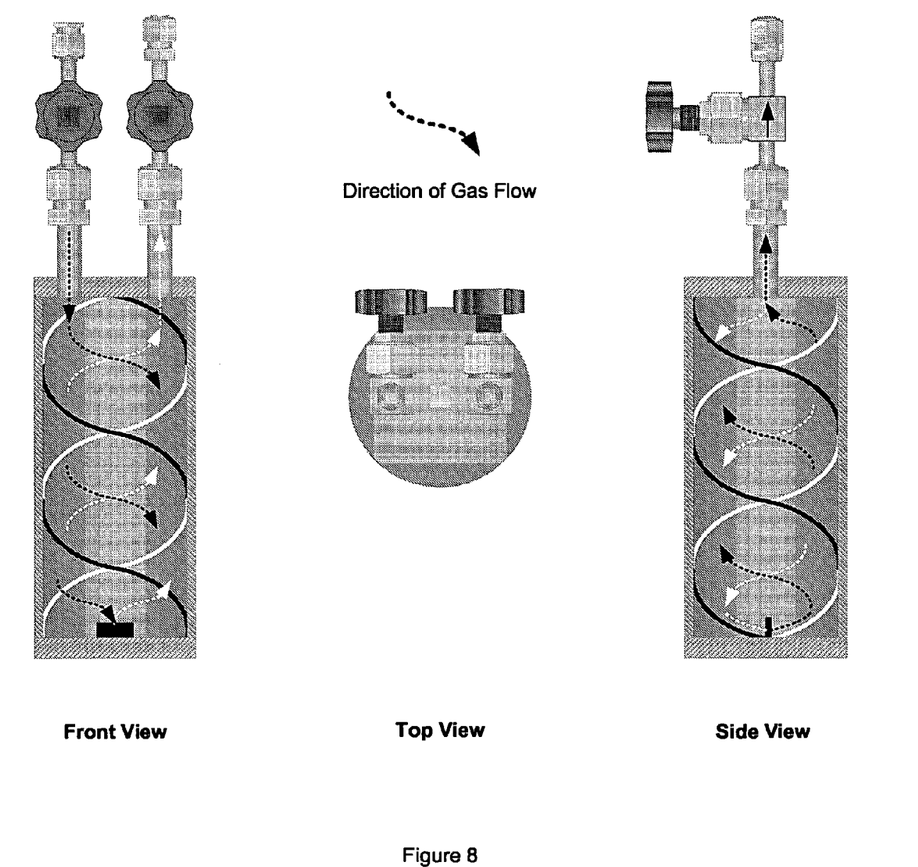
FIG. 8: A helical cylinder in which gas flows downward through one side of the helix, connects to the second side of the helix at the bottom of the bubbler, and travels upward to the exit. The effective length of helix is equal to or greater than 6 times the average cross-section of one of the helical chambers.

The bubbler can be supplied with or without a gas-dispersing device at the bottom of each chamber. The gas-dispersing device can be a porous element such as a frit having a controlled porosity (see FIG. 6), or the gas dispersing tube (see FIG. 7);

The total length of the chamber or connected chambers must be sufficient for the carrier gas to be >90% saturated with the compound at the outlet of the bubbler chamber assembly;

The bubbler chamber assembly may comprise two or more chambers connected in series with at least one of the chambers comprising the annular space of concentric chambers;

The bubbler can be enclosed in an outside container equipped with inlet and outlet ports for circulation of constant temperature fluid;

The individual chambers of the bubbler can be jacketed with a heat exchanger;

The bubbler can be used with any compound, liquid or solid, organometallic or non-organometallic, so long as the compound is capable of vaporization under practical conditions. Possible compounds include the aforementioned organometallic compounds, as well as non-organometallic compounds, including one or more of: trimethylaluminum (TMAL), trimethylgallium (TMG), triethylgallium (TEG), trimethylantimony (TMSb), dimethyl hydrazine (DMHy), trimethylindium (TMI), and cyclopetadienylmagnesium ($Cp_2Mg$), Carbon tetrabromide ($CBr_4$), Hafnium tetrachloride ($HfCl_4$)

When the compound is a liquid, the flow of carrier gas will only be up-flow through the chamber or chambers;

When the compound is a solid it may comprise particles of any size and shape, so long as the particles may be conveniently loaded and packed into the bubbler chamber or chambers through openings provided for that purpose;

The carrier gas may be selected from the group of gasses consisting of hydrogen, nitrogen and the inert gases (examples are: argon, helium). Hydrogen is the preferred carrier gas;

The inside walls of the chamber or chambers may be corrugated or contain baffles with the corrugations or baffles substantially aligned perpendicular to the direction of flow of the carrier gas;

The compound to be vaporized may comprise particles of a solid mixed with packing. The packing may comprise substantially spherical particles or other shapes inert to the compound and carrier gas. The packing may comprise stainless steel and/or glass balls or other shapes.

The following examples are given for illustrating the invention:

Example 1

Figure 2:
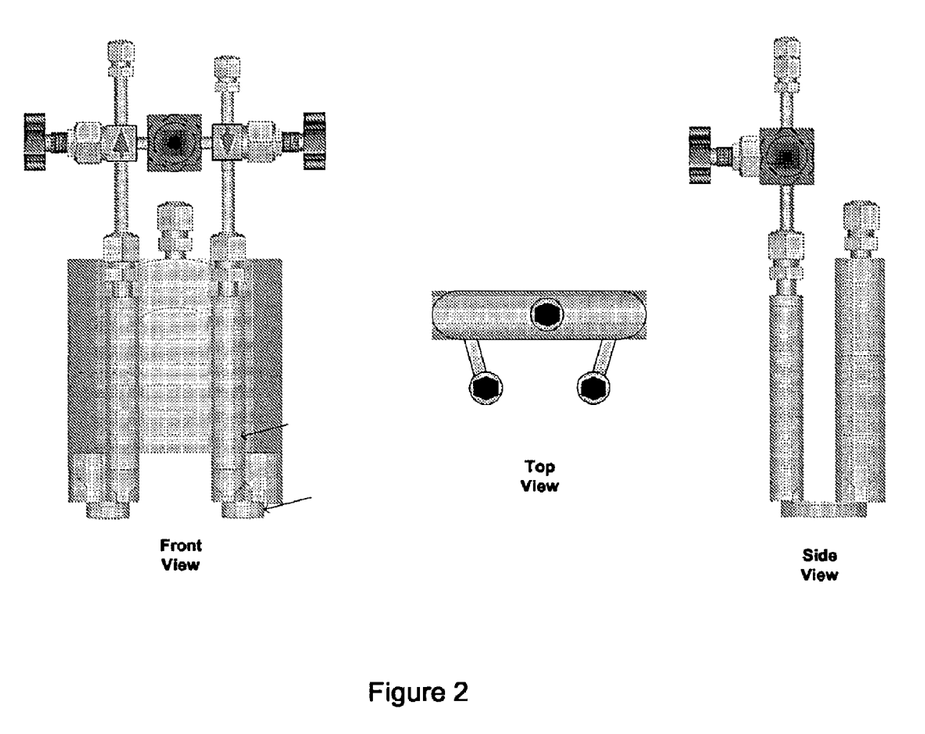
FIG. 2: A bubbler design with three chambers of different diameter sizes and shapes: two smaller diameter inlet and outlet chambers; and one U-tube larger diameter chamber. All chambers are connected in series via reducing tubing.
Figure 3:
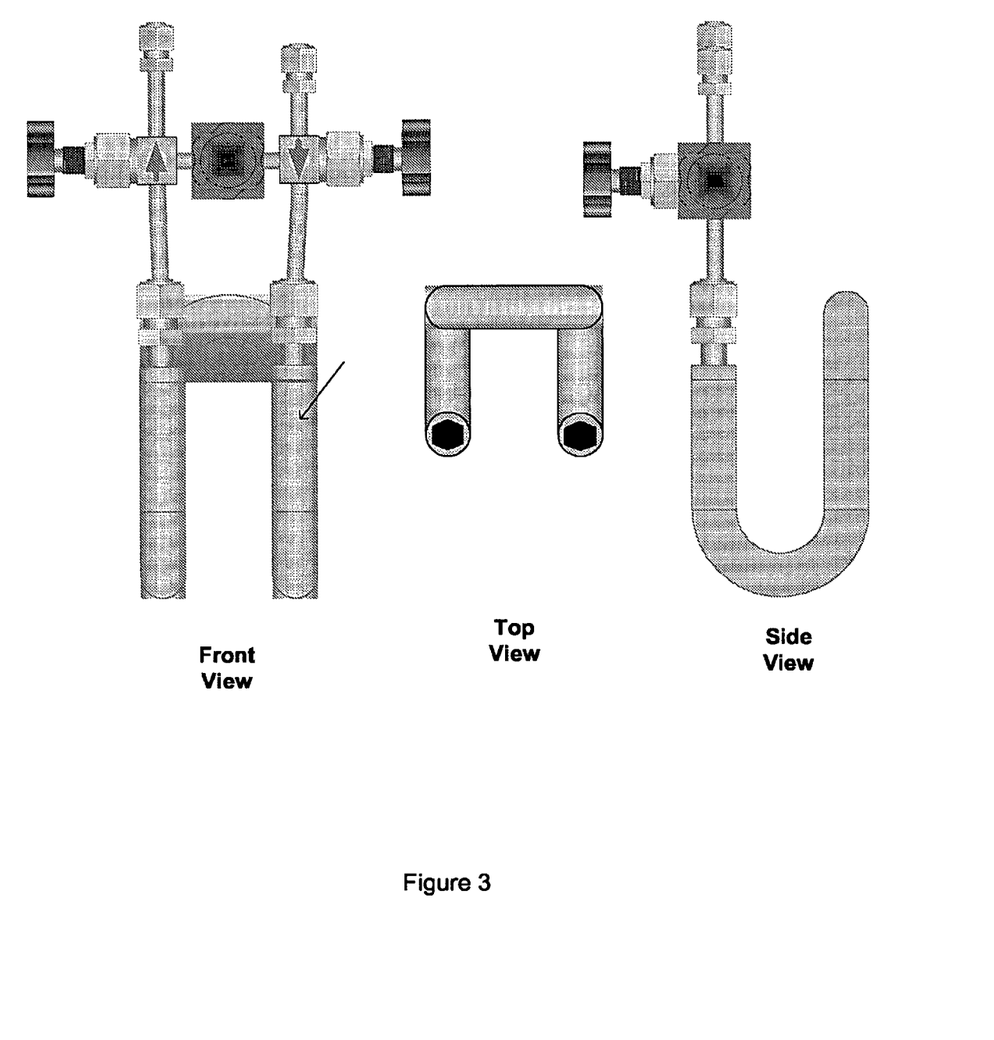
FIG. 3: A bubbler with three 180° return bend radius elbows.
Figure 4:
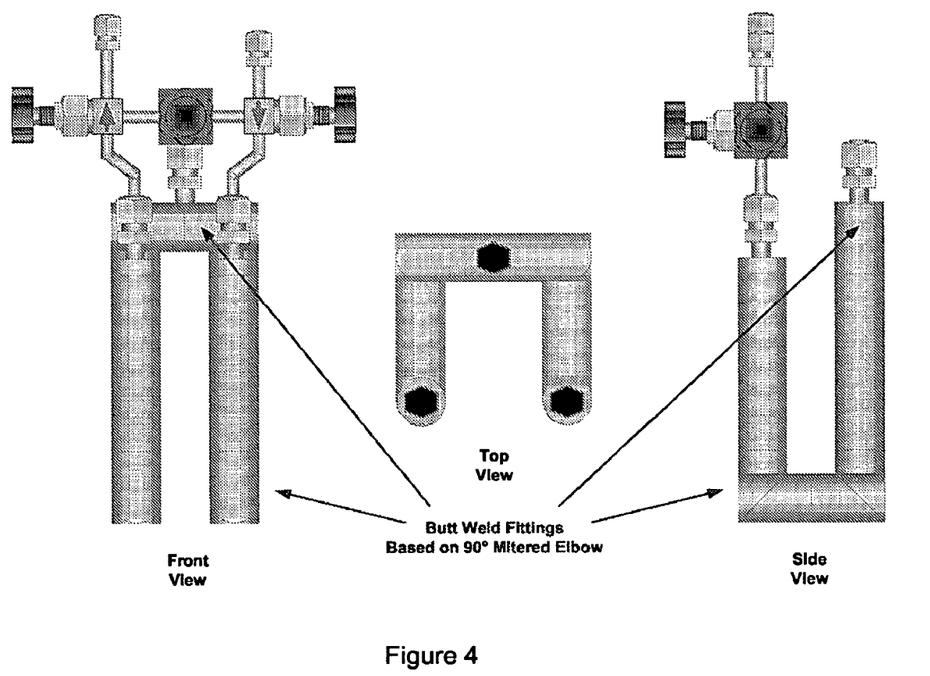
FIG. 4: A multi-chamber bubbler with three 90° mitered elbows.
Figure 5:
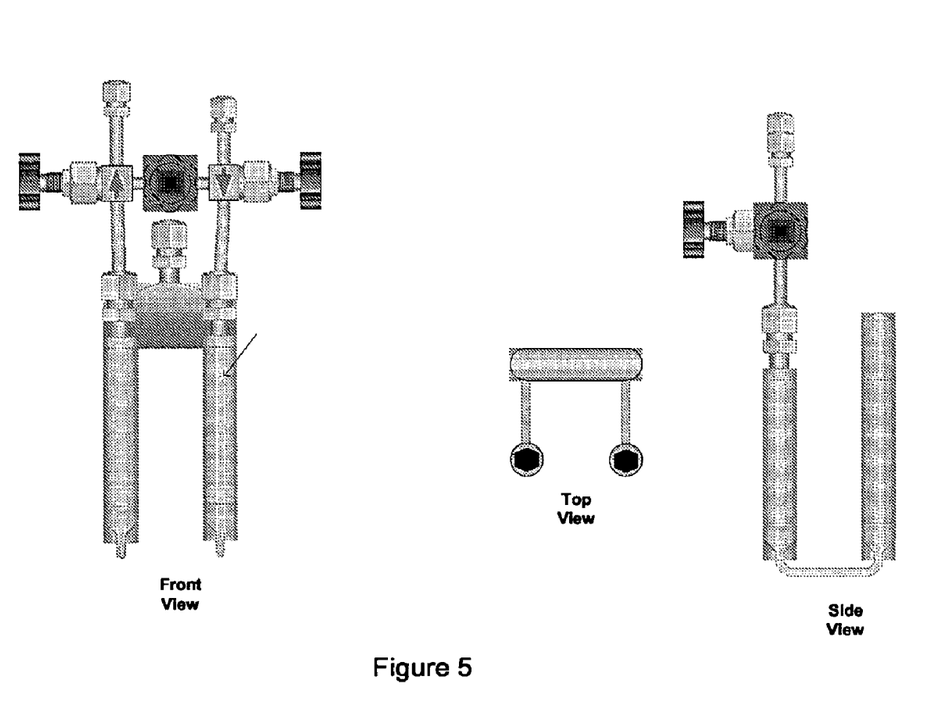
FIG. 5: A bubbler with three chambers of the same diameter tubing: two straight tubing inlet and outlet chambers; and one U-tube chamber. All chambers are connected in series via reducing tubing.
Figure 9:
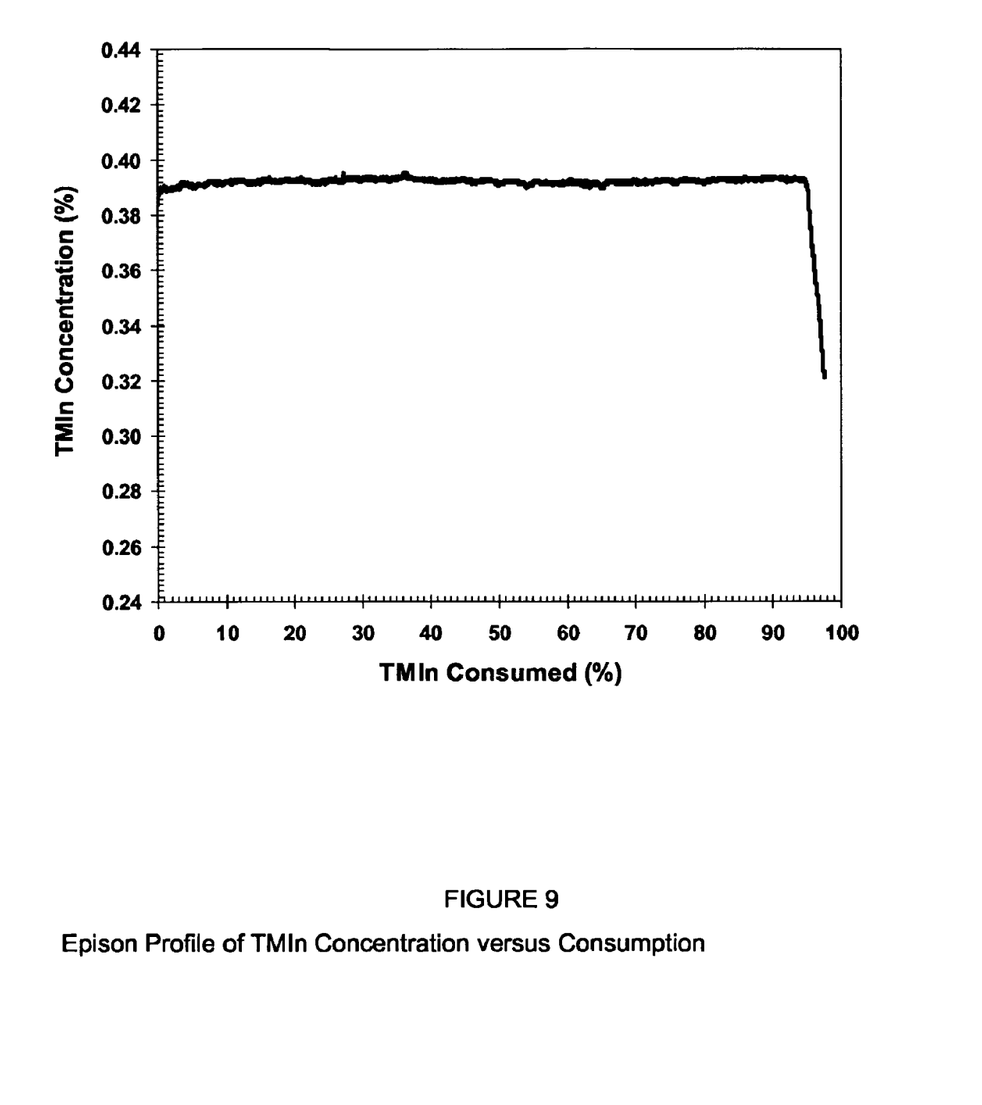
FIG. 9: An Epison Profile associated with Example 1.

Trimethylindium (320 g) was charged into the bubbler of FIG. 2, and hydrogen was used as the carrier gas. The conditions for this experiment were 300 sccm hydrogen flow rate, controlled downstream pressure of 225 Torr, and a constant temperature of 17° C. An Epison tool was used to monitor the TMI concentrations in hydrogen. As shown on the Epison Profile of FIG. 9, the TMI delivery rate was constant to at least 95% depletion of TMI charge.

Experimental Details:
Bubbler of FIG. 2
Fill Weight: 320 g TMIn
Length to Equivalent Diameter: 20
Total number of chambers: 3
Testing Conditions:
    P=225 Torr (300 mbar)
    T=17° C.
    $H_2$ flow=300 sccm Example 2

Figure 10:
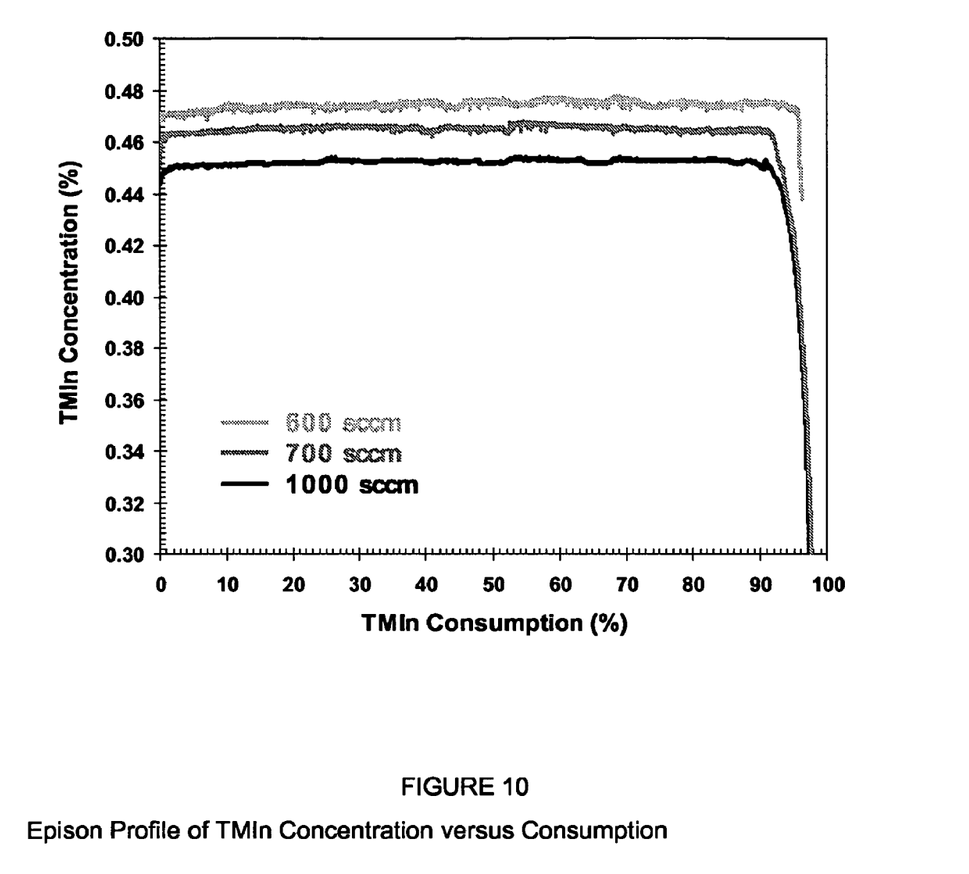
FIG. 10: An Epison Profile associated with Example 2.

Trimethylindium (320 g) was charged into the bubbler of FIG. 2, and hydrogen was used as the carrier gas. The conditions for this series of experiments were 600, 700 and 100 sccm hydrogen flow rate, controlled downstream pressure of 180 Torr, and a constant temperature of 17° C. An Epison tool was used to monitor the TMI concentrations in hydrogen. As shown on the Epison Profile on FIG. 10, the TMI delivery rate was constant to at least 92% depletion of TMI charge.

Experimental Details:
    Bubbler of FIG. 2
    Fill Weight: 320 g TMIn
    Length to Equivalent Diameter: 20
    Total number of chambers: 3
    Testing Conditions:
        P=180 Torr (240 mbar)
        T=17° C.
        $H_2$ flow=600, 750, 1000 scc Example 3

Figure 11:
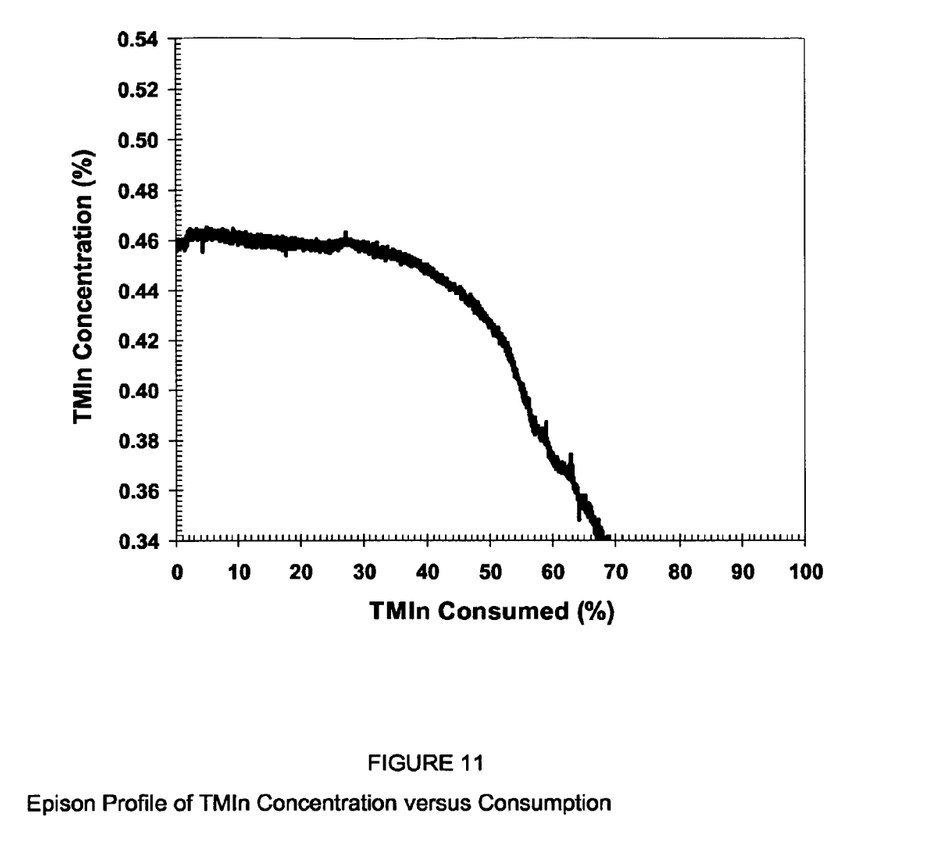
FIG. 11: An Epison Profile associated with Example 3.

Trimethylindium (100 g) was charged into a single chamber bubbler, and nitrogen was used as the carrier gas. The conditions for this experiment were 250 SCCM nitrogen flow rate, controlled downstream pressure of 360 Torr, and a constant temperature of 25° C. An Epison tool was used to monitor the TMI concentrations in nitrogen. As shown on the Epison Profile of FIG. 11, the TMI delivery rate fell off significantly at about 30% depletion of TMI charge.

Experimental Details:
  Bubbler of FIG. 11 (Conventional cylinder)
  Fill Weight: 100 g TMIn
  Length to Equivalent Diameter: 2.125
  Total number of chambers: 1
  Testing Conditions:
    P=360 Torr (480 mbar)
    T=25° C.
    $N_2$ flow=250 sccm The above examples very convincingly illustrate that a bubbler having a ratio of the length of the chamber or combined length of chambers, connected in series with respect to the direction of flow of the carrier gas through the chamber or chambers, and the average diameter equivalent of the cross section of the chamber or chambers not less than about 6:1, achieves a delivery rate of vaporized compound that is constant to an extent not possible when the ratio is less than about 6:1.

The invention claimed is:

1. A bubbler for providing a vaporized compound in a chemical vapor deposition process comprising: (a) a bubbler chamber assembly having an inlet and an outlet; (b) a means for providing an inert carrier gas to said compound connected to said inlet; (c) a means for removing said vaporized compound and carrier gas from said chamber assembly and conveying said compound to said chemical vapor deposition process connected to said outlet; and (d) temperature control means in which said bubbler chamber assembly is placed that causes said compound to vaporize into said carrier gas; said bubbler chamber assembly comprising two or more chambers connected in series with the flow of said vaporized compound and carrier gas alternating between up flow and down flow between adjoining chambers in said series, all chambers being in substantially vertical orientation, in which chambers contain a solid source of said compound, the ratio between the length of said combined length of chambers connected in series with respect to the direction of flow of said carrier gas through said chambers and the average diameter equivalent of the cross section of said chambers with respect to the direction of flow of said carrier gas through said chamber or chambers is not less than about 6:1.

2. The bubbler of claim 1 wherein the total length of said chambers is sufficient for said carrier gas to be saturated or near saturated with said compound at said outlet of said bubbler chamber assembly until most of said compound is depleted.

3. The bubbler of claim 1 wherein the chambers in said bubbler chamber assembly are positioned at least about 45° from the horizontal.

4. The bubbler of claim 1 wherein the chambers comprising said bubbler assembly have average internal diameters of from about 1.3 cm to about 7.6 cm.

5. The bubbler of claim 1 wherein the chambers comprising said bubbler assembly have the same or different average internal diameters throughout their length.

6. The bubbler of claim 1 wherein said bubbler assembly comprises two or more of said chambers in series with connectors between chambers in adjoining sequence comprising tubes connected at each end with said chambers in adjoining sequence, the connection between said chambers of adjoining sequence and chambers of said connectors being mitered fittings.

7. The bubbler of claim 1 wherein said bubbler assembly comprises two or more of said chambers in series with connectors between chambers in adjoining sequence comprising tubes connected at each end with said chambers in adjoining sequence, the connection between said chambers of adjoining sequence and chambers of said connectors being rounded fittings.

8. The bubbler of claim 1 wherein said bubbler chamber assembly comprises two or more chambers connected in series with at least one of said chambers comprising the annular space of concentric chambers.

9. The bubbler of claim 1 wherein said compound comprises an organometallic compound.

10. The bubbler of claim 9 wherein said organometallic compound is selected from the group consisting of trimethylaluminum (TMAL), trimethylgallium (TMG), triethylgallium (TEG), trimethylantimony (TMSb), dimethyl hydrazine (DMHy), trimethylindium (TMI), and cyclopetadienylmagnesium ($Cp_2Mg$).

11. The bubbler of claim 10 wherein said organometallic compound comprises trimethylindium and/or cyclopentadienylmagnesium.

12. The bubbler of claim 1 wherein said compound comprises carbon tetrabromide and/or Hafnium tetrachloride.

13. The bubbler of claim 1 wherein said carrier gas is selected from the group consisting of hydrogen, nitrogen and the inert gases.

14. The bubbler of claim 13 wherein said carrier gas comprises hydrogen.

15. The bubbler of claim 1 wherein the inside walls of said chamber or chambers are corrugated or contain baffles with the corrugations or baffles substantially aligned perpendicular to the direction of flow of said carrier gas.

16. The bubbler of claim 1 wherein said compound comprises particles of a solid mixed with packing.

17. The bubbler of claim 16 wherein said packing comprises substantially spherical particles or other shapes inert to said compound and carrier gas.

18. The bubbler of claim 17 wherein said spherical particles or other shapes comprise stainless steel and/or glass.

19. The bubbler of claim 1 wherein the ratio between the length of said combined length of chambers connected in series with respect to the direction of flow of said carrier gas through said chambers and the average diameter equivalent of the cross section of said chambers with respect to the direction of flow of said carrier gas through said chamber or chambers is not less than 6:1.

20. The bubbler of claim 1 wherein the ratio between the length of said combined length of chambers connected in series with respect to the direction of flow of said carrier gas through said chambers and the average diameter equivalent of the cross section of said chambers with respect to the direction of flow of said carrier gas through said chamber or chambers is about 6:1.

21. A bubbler for providing a vaporized compound in a chemical vapor deposition process comprising: (a) a bubbler chamber assembly having an inlet and an outlet; (b) a means for providing an inert carrier gas to said compound connected to said inlet; (c) a means for removing said vaporized compound and carrier gas from said chamber assembly and conveying said compound to said chemical vapor deposition process connected to said outlet; and (d) temperature control means in which said bubbler chamber assembly is placed that causes said compound to vaporize into said carrier gas; said bubbler chamber assembly comprising two or more chambers connected in series with the flow of said vaporized compound and carrier gas alternating between up flow and down flow between adjoining chambers in said series, all chambers being in substantially vertical orientation, in which chambers contain a solid source of said compound.

22. The bubbler of claim 21 wherein the ratio between the length of said combined length of chambers connected in series with respect to the direction of flow of said carrier gas through said chambers and the average diameter equivalent of the cross section of said chambers with respect to the direction of flow of said carrier gas through said chamber or chambers is not less than about 6:1.

23. The bubbler of claim 21 wherein the ratio between the length of said combined length of chambers connected in series with respect to the direction of flow of said carrier gas through said chambers and the average diameter equivalent of the cross section of said chambers with respect to the direction of flow of said carrier gas through said chamber or chambers is not less than 6:1.

* * * * *